US010718255B2

(12) United States Patent
Edwards et al.

(10) Patent No.: US 10,718,255 B2
(45) Date of Patent: Jul. 21, 2020

(54) COOLING FLOW CONTROL SYSTEM

(71) Applicants: Rolls-Royce North American Technologies Inc.; Rolls-Royce Corporation, Indianapolis, IN (US)

(72) Inventors: Daniel G. Edwards, Brownsburg, IN (US); Eric E. Wilson, Mooresville, IN (US)

(73) Assignees: Rolls-Royce North American Technologies Inc., Indianapolis, IN (US); Rolls-Royce Corporation, Indianapolis, IN (US)

( * ) Notice: Subject to any disclaimer, the term of this patent is extended or adjusted under 35 U.S.C. 154(b) by 194 days.

(21) Appl. No.: 15/902,674

(22) Filed: Feb. 22, 2018

(65) Prior Publication Data
US 2019/0257238 A1    Aug. 22, 2019

(51) Int. Cl.
*F01P 5/02* (2006.01)
*F01P 7/14* (2006.01)
(Continued)

(52) U.S. Cl.
CPC .................................... *F01P 5/02* (2013.01);
*F01P 7/14* (2013.01); *F25B 25/005* (2013.01);
*F25D 16/00* (2013.01); *F25D 17/02*
(2013.01); *F24F 2005/0025* (2013.01); *F25B 2400/24* (2013.01); *F28D 20/02* (2013.01);
*H05K 7/20* (2013.01)

(58) Field of Classification Search
CPC ... F01P 5/02; F01P 7/14; F25B 25/005; F25D 16/00; F25D 17/02; F24F 2005/0025; F24F 2400/24; F28D 20/02; H05K 7/20
See application file for complete search history.

(56) References Cited

U.S. PATENT DOCUMENTS 3,863,612 A    2/1975  Wiener
4,697,551 A    10/1987  Larsen et al.
(Continued)

FOREIGN PATENT DOCUMENTS

CN          106 152 341 A      11/2016
DE     10 2004 041 252 A1       3/2006
(Continued)

OTHER PUBLICATIONS

Extended European Search Report, issued in European Application 19153122.7, dated Jul. 22, 2019, pp. 1-8, European Patent Office, Munich, Germany.

*Primary Examiner* — Jon T. Schermerhorn, Jr.
(74) *Attorney, Agent, or Firm* — Brinks Gilson & Lione

(57) ABSTRACT

A cooling system may include a cooling pump that causes cooling fluid received from a thermal load to flow to a cooling source, a low-load valve, a high-load valve, a thermal energy store, and a mixing valve. The cooling source and the low-load valve may be downstream from the cooling pump. The high load valve and thermal energy storage may be downstream from the cooling source. The first input of the mixing valve may be downstream from the thermal energy storage. The second input of the mixing valve may be downstream from the low-load valve and the high-load valve. The thermal load may be downstream from an output of the mixing valve. The cooling system may switch between a low load mode and a high load mode with coordinated operation of the low-load valve and high-load valve.

13 Claims, 7 Drawing Sheets

(51) Int. Cl.

| | | |
|---|---|---|
| *F25B 25/00* | (2006.01) | |
| *F25D 16/00* | (2006.01) | |
| *F25D 17/02* | (2006.01) | |
| *F28D 20/02* | (2006.01) | |
| *H05K 7/20* | (2006.01) | |
| *F24F 5/00* | (2006.01) | |

(56) References Cited

U.S. PATENT DOCUMENTS

| | | | |
|---|---|---|---|
| 4,759,316 A | | 7/1988 | Itakura |
| 5,386,709 A | * | 2/1995 | Aaron .................... F25B 5/02 |
| | | | 62/199 |
| 6,105,659 A | | 8/2000 | Pocol et al. |
| 6,464,027 B1 | | 10/2002 | Dage et al. |
| 6,667,999 B2 | | 12/2003 | Hasson et al. |
| 8,023,542 B2 | | 9/2011 | Vetrovec |
| 9,470,115 B2 | * | 10/2016 | Ernst .................... F01K 23/065 |
| 9,733,005 B2 | * | 8/2017 | Kopko .................... F25D 3/005 |
| 2007/0104233 A1 | | 5/2007 | Vetrovec |
| 2010/0186440 A1 | * | 7/2010 | Hong .................... F28D 7/103 |
| | | | 62/434 |
| 2014/0260376 A1 | | 9/2014 | Kopko et al. |
| 2015/0136048 A1 | | 5/2015 | Sundemo et al. |

FOREIGN PATENT DOCUMENTS

| | | |
|---|---|---|
| GB | 2 173 886 A | 10/1986 |
| WO | WO 2006/021440 A1 | 3/2006 |
| WO | WO 2015/001976 A1 | 1/2015 |

* cited by examiner

COOLING FLOW CONTROL SYSTEM

TECHNICAL FIELD

This disclosure relates to thermal management and, in particular, to thermal management of steady-state and transient thermal loads.

BACKGROUND

Cooling systems may be designed to handle peak constant thermal loads without regard to whether loads may be transient or without regard to the physical size of components in the thermal management system. The components of such cooling systems may be oversized or inefficiently controlled and yet still meet design goals. Present approaches to thermal management may suffer from a variety of drawbacks, limitations, and disadvantages. There is a need for inventive systems, methods, components, and apparatuses described herein.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
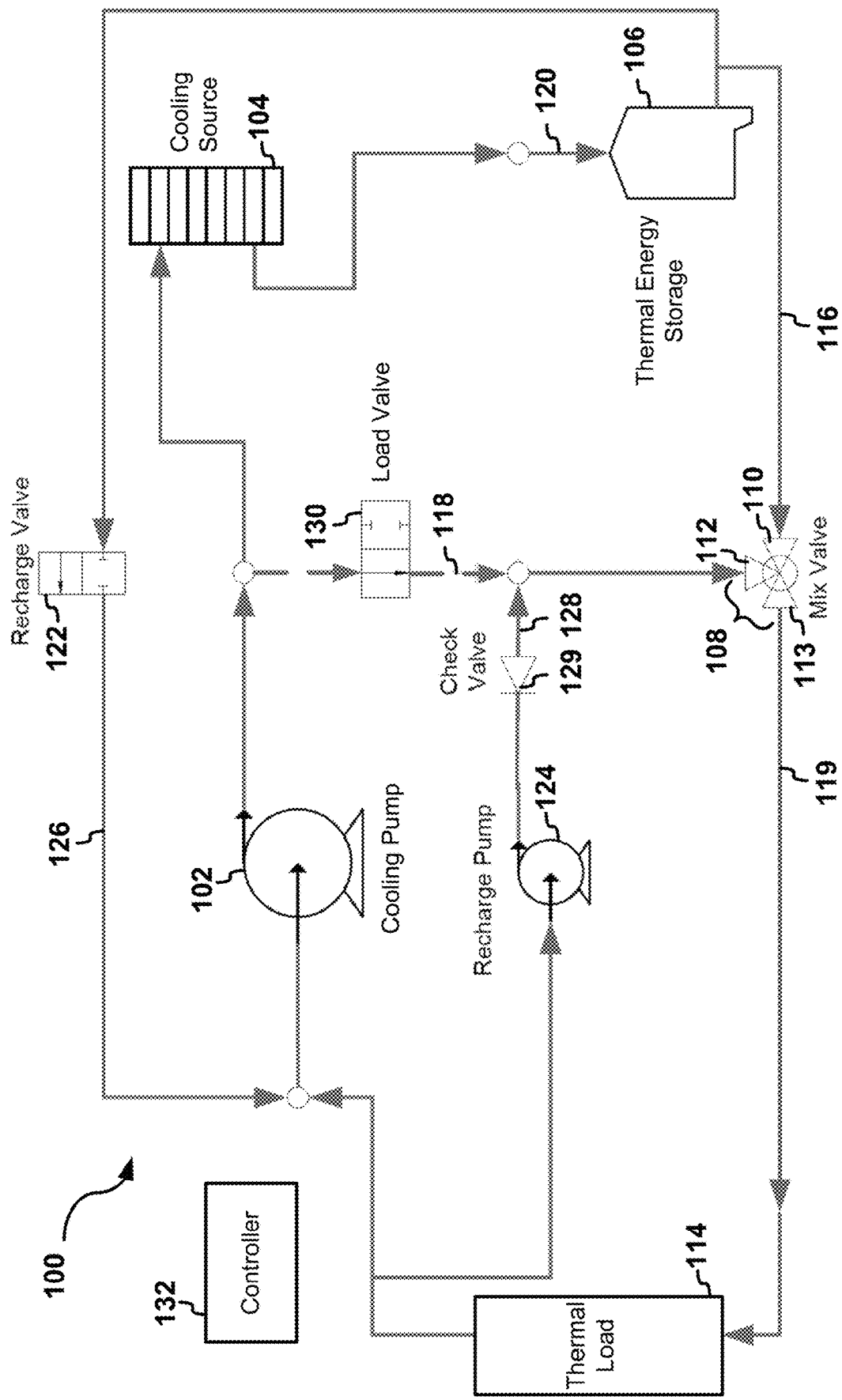
FIG. 1 illustrates a first example of a system.

By way of an introductory example, the system may include a cooling pump, a cooling source, a thermal energy storage, a mixing valve having a first input, a second input, and an output, a recharge valve, a recharge pump, and/or a controller.

The output of the mixing valve may be in fluid communication with a thermal load. The first input of the mixing valve may be in fluid communication with the thermal energy storage. The second input of the mixing valve may be in fluid communication with the recharge pump. The thermal energy storage may receive cooling fluid heated by the thermal load and pumped through the cooling source by the cooling pump.

Operation of the recharge pump may cause heated cooling fluid output from the thermal load to bypass the cooling pump and flow to the second input of the mixing valve. The recharge valve may be in fluid communication with the thermal energy storage and the cooling pump. The recharge valve may regulate a recharge fluid flow comprising cooling fluid received from the thermal energy storage.

In response to detection of a recharge enable trigger, the controller may open to the recharge valve to enable the recharge fluid flow and cause the operation of the recharge pump. In response to detection of a recharge disable trigger, the controller may close the recharge valve to disable the recharge fluid flow and stop the operation of the recharge pump.

In some examples, the system may include a low-load valve and/or a high-load valve. The cooling source and the low-load valve may be downstream from the cooling pump. The high-load valve and thermal energy storage may be downstream from the cooling source. The first input of the mixing valve may be downstream from the thermal energy storage and the second input of the mixing valve is downstream from the low-load valve and the high-load valve. The thermal load may be downstream from the output of the mixing valve.

Cooling fluid from the thermal load that is pumped by the cooling pump may flow to the second input of the mixing valve in response to the low-load valve being open and the high-load valve being closed.

Cooling fluid from the thermal load and cooled by the cooling source may flow to the second input of the mixing valve in response to the low-load valve being closed and the high-load valve being opened.

One interesting feature of the systems and methods described below may be that cooling fluid flowing within a cooling circuit may be controlled with one or more valves and/or pumps to reduce size, capacity, and power consumption of cooling components. For example, the recharge pump may provide the mixing valve with heated cooling fluid while the cooling pump recirculates cooling fluid from the thermal energy storage. The system and methods described below may provide rapid re-chilling of the thermal energy storage for a thermal load that operates within a temperature range. Alternatively or in addition, the system and methods described below may enable use of smaller cooling components while maintaining cooling availability for thermal loads with transient cooling demands.

Alternatively, or in addition, an interesting feature of the systems and methods described below may be that coordinated operation of the low-load valve and the high-load valve may vary a source of cooling fluid used in a mixture of cooling fluid that cools the thermal load. Varying the source of cooling fluid used in mixture may preserve a cooling potential of the thermal energy storage and/or enable the use of smaller cooling components.

FIG. 1 illustrates a first example of a system 100. The system 100 may include a cooling pump 102, a cooling source 104, a thermal energy storage 106, and/or a mixing valve 108. The mixing valve 108 may include a first input 110, a second input 112, and an output 113. The cooling pump 102 may be in fluid communication with the cooling source 104, the second input 112 of the mixing valve 108, and a thermal load 114. The thermal energy storage 106 may be in fluid communication with the cooling source 104 and the first input 110 of the mixing valve 108. The output 113 of the mixing valve 108 may be in fluid communication with the thermal load 114.

The mixing valve 108 may influence a temperature to the thermal load 114 with a cooling fluid that is a mixture of a first fluid flow 116 and a second fluid flow 118. The mixing valve 108 may receive the first fluid flow 116 from the thermal energy storage 106. For example, the first fluid flow 116 may include cooling fluid from the thermal energy storage 106 that flows to the first input 110 of the mixing valve 108. The first fluid flow 116 may include cooling fluid that flows from the thermal energy storage. Alternatively or in addition, the first fluid flow 116 may include cooling fluid heated by the thermal load 114, cooled by the cooling source 104, and provided by the thermal energy storage 106.

The second fluid flow 118 may include cooling fluid heated by the thermal load 114 and pumped through the cooling pump 102. For example, the second fluid flow 118 may include cooling fluid pumped by the cooling pump 102 that flows to the second input 112 of the mixing valve 108. Alternatively or in addition, the second fluid flow 118 may include cooling fluid pumped by the cooling pump 102 that bypasses the cooling source 104. The second fluid flow 118 may optionally be cooled by the cooling source 104 after being heated by the thermal load 114. For example, the second fluid flow 118 may include cooling fluid that flows from the thermal load 114 to the second input 112 of the mixing valve 108.

The mixing valve 108 may bias the first input 110 or the second input 112 to achieve a target cooling temperature. The first input 110 may receive cooling fluid that is cooler than the target cooling temperature and the second input 112 may receive cooling fluid that is warmer than the target cooling temperature. For example, the first fluid flow 116, which was cooled by the cooling source 104 and stored in the thermal energy storage 106, may be cooler than the target cooling temperature. The second fluid flow 118, which was warmed by the thermal load 114 and/or the cooling pump 102, may include cooling fluid that is warmer than the target cooling temperature. The target cooling temperature may refer to a temperature of an output fluid flow 119 from an output 113 of the mixing valve 108 and/or a temperature of the thermal load 114. In some examples, the thermal load 114 may be cooled within a range of target cooling temperatures including an upper temperature and a lower temperature.

The cooling source 104 may supply the thermal energy storage 106 with a third fluid flow 120. The third fluid flow 120 may include cooling fluid heated by the thermal load 114 and cooled by the cooling source 104. In some examples, the third fluid flow 120 may flow from the cooling source 104 to the thermal energy storage 106. Alternatively or in addition, the cooling pump 102 may pump the third fluid flow 120 through the cooling source 104 to the thermal energy storage 106.

In some examples, using the thermal energy storage 106 to supplement cooling may allow for a decreased size of the cooling source 104. For example, the size of the cooling source 104 may be decreased such that the cooling source 104 provides sufficient cooling to maintain the thermal energy storage 106 for steady-state loads and to recharge the thermal energy storage 106 before or after intervals of increased thermal demand. In some circumstances, cooling available by the thermal energy storage 106 may be diminished and/or become diminished. For example, the demand of the thermal load 114 may exceed a cooling output of the cooling source 104. Alternatively or in addition, an amount of cooling potential available by the thermal energy storage 106 may be depleted or diminished when the cooling source 104 is not available for cooling. For example, the cooling potential of the thermal energy storage 106 may be dismissed during system start up or after a period in which the cooling source is not cooling. Alternatively or in addition, the mixing valve 108 may bias the first input 110 of the mixing valve 108 over periods of increased demand by the thermal load 114. Biasing the first input 110 of the mixing valve 108 may cause the cooling potential available by the thermal energy storage 106 to decrease faster.

In some examples, the mixing valve 108 may bias the first input 110 to receive cool cooling fluid from the thermal energy storage 106 during periods of increased thermal demand. Before or after the periods of increased thermal demand (or when the thermal load 114 is sufficiently cooled), the mixing valve 108 may bias the second input 112 and receive cooling fluid that bypasses the thermal energy storage. Alternatively or in addition, the cooling fluid directed to the second input 112 of the mixing valve 108 cooling fluid may bypass the thermal energy storage 106, the cooling pump 102, and/or the cooling source 104.

The system 100 may recharge the thermal energy storage 106. Recharging the thermal energy storage 106 may refer to providing chilled cooling fluid to the thermal energy storage 106 such that a cooling potential of the thermal energy storage 106 increases. Alternatively or in addition, recharging the thermal energy storage 106 may involve decreasing a temperature of the thermal energy storage 106, or cooling fluid residing in the thermal energy storage 106. In some examples, the rapid recharging of the thermal energy storage 106 may occur between periods of peak thermal demand.

The system 100 may include a recharge valve 122 and a recharge pump 124. The recharge valve 122 may be in fluid communication with the thermal energy storage 106 and the cooling pump 102. The recharge pump 124 may be in fluid communication with the thermal load 114 and the second input 112 of the mixing valve 108.

Opening of the recharge valve 122 may enable the cooling pump 102 to cause a recharge fluid flow 126 from an output of the thermal energy storage 106 to the cooling pump 102. When the recharge valve 122 is opened, the cooling pump 102 may pump cooling fluid from the thermal energy storage 106, through the cooling source 104 and back to the thermal energy storage 106. Alternatively or in addition, the recharge valve 122 may cause cooling fluid to bypass the thermal load 114 and recirculate to the thermal energy storage 106. The cooling potential of the thermal energy storage 106 may increase as the cooling fluid recirculates through the cooling source 104 without being recirculated through the thermal load 114.

Cooling fluid flowing from the cooling pump 102 may progressively become cooler when the recharge valve is opened. In some examples, the second fluid flow 118 may become too cool for the mixing valve 108 to achieve the target cooling temperature when the recharge valve 122 is opened. The recharge pump 124 may be activated to circulate a bypass fluid flow 128 to the mixing valve 108. The bypass fluid flow 128 may include cooling fluid heated by the thermal load 114 that bypasses the cooling pump 102. The thermal load 114 may receive cooling from the mixing valve 108 using a mixture of the first fluid flow 116 received from the thermal energy storage 106 and the bypass fluid flow 128 caused by the recharge pump 124.

The system 100 may include a check valve 129. The check valve 129 may receive cooling fluid pumped by the recharge pump 124. Alternatively or in addition, the mixing valve 108 may receive the bypass fluid flow 128 from the check valve 129. The check valve 129 may prevent cooling fluid from output from the cooling pump 102 from flowing toward an output of the recharge pump 124. Alternatively or in addition, the check valve 129 may prevent the cooling pump 102 from drawing cooling fluid from the output of the cooling pump 102. For example, when the recharge pump 124 is not operating and/or when the load valve 130 is opened, the check valve 129 may prevent the cooling pump 102 from drawing cooling fluid directly from the output of the cooling pump 102.

When the recharge valve 122 is opened, the second fluid flow 118 may become increasing cooler. The second fluid flow 118, or the other fluid flows to the second input 112 of the mixing valve 108, may be disabled in order to maintain a warm fluid flow to at least one input of the mixing valve 108. For example, when the recharge valve 122 is opened, the second input 112 of the mixing valve 108 may receive heated cooling fluid from the recharge pump 124 instead of the cooling pump 102.

The system 100 may include a load valve 130. The load valve 130 may be fluid communication with the cooling pump 102 and the mixing valve 108. The load valve 130 may be downstream of the cooling pump 102. The second input 112 of the mixing valve 108 may be downstream from the load valve 130. An input of the load valve 130 may receive cooling fluid from the cooling pump 102. The cooling fluid from the cooling pump 102 may flow to the mixing valve 108 from an output of the load valve 130. Opening the load valve 130 may enable the second fluid flow 118. Closing the load valve 130 may disable the second fluid flow 118. Recharging the thermal energy storage 106 may include closing the load valve 130, operating the recharge pump 124, and/or opening the recharge valve 122.

In other examples, such as the example illustrated in FIGS. 2A-C below, the system 100 may include multiple load valves. Each of the load valves may provide cooing fluid to the mixing valve 108. For example, the multiple load valves may include a first load valve and a second load valve. The first load valve may receive cooling fluid pumped from the thermal load 114 without being cooled by the cooling source 104. The second load valve that received cooling fluid cooled by the cooling source 104. In some examples, to recharge the thermal energy storage 106, one or more of the load valves may be closed. Alternatively or in addition, closing all of the load valves may result in the recharge pump 124 exclusively providing cooling fluid to the second input 112 of the mixing valve 108. In other examples, one or more of the load valves may cause cooling fluid to flow to the second input 112 of the mixing valve 108 while the recharge pump 124 is operating.

The cooling pump 102, cooling source 104, mixing valve 108, recharge valve 122, the recharge pump 124, and/or the load valve 130 may each receive one or more control signals. For example, the one or more control signals may cause the cooling pump 102 and/or the recharge pump 124 to independently start pumping, stop pumping, and/or vary a flow rate. In another example, the one or more control signals may cause the cooling source 104 to start cooling, stop cooling, and/or control an amount of cooling. Alternatively or in addition, the one or more control signals may cause the mixing valve 108, the recharge valve 122 and/or the load valve 130 to independently open and/or close. The one or more signals may include analog or digital signals. In some examples, the one or more signals may include a message that follows a communication protocol. Alternatively or in addition, the one or more signals may include electric power.

The system 100 many further include a controller 132. The controller 132 may control or affect operation of the cooling pump 102, the cooling source 104, the mixing valve 108, the recharge valve 122, the recharge pump 124, and/or the load valve 130. For example, the controller 132 may communicate the one or more control signals to the cooling pump 102, the cooling source 104, the mixing valve 108, the recharge valve 122, the recharge pump 124, and/or the load valve 130. Alternatively or in addition, the controller 132 may communicate with power sources that control an amount of electric power provided to the cooling pump 102, the cooling source 104, the mixing valve 108, the recharge valve 122, the recharge pump 124, and/or the load valve 130. In some examples, the controller 132 may communicate with one or more additional controller 132s that control operation of the cooling pump 102, the cooling source 104, the mixing valve 108, the recharge valve 122, the recharge pump 124, and/or the load valve 130.

The system 100 may be implemented and/or described in various ways. For example, the cooling pump 102 may cause cooling fluid received from a thermal load 114 to flow to the cooling source 104, the thermal energy storage 106, and the mixing valve 108. The cooling pump 102 may be downstream from the thermal load 114 and the recharge valve 122. The cooling source 104 may be downstream from the cooling pump 102. The thermal energy storage 106 may be downstream from the cooling source 104. The recharge pump 124 may pump cooling fluid received from the thermal load 114 to the second input 112 of the mixing valve 108. The recharge pump 124 may be downstream from the thermal load 114. The first input 110 of the mixing valve 108 may be downstream from the thermal energy storage 106. The second input 112 of the mixing valve 108 may be downstream from the cooling pump 102 and the recharge pump 124. The thermal load 114 may be downstream of the output 113 of the mixing valve 108.

In general, unless explicitly stated otherwise, a first component is said to be downstream from a second component if the first component may receive fluid from output from the second component. The first component is said to be downstream from the second component even when other components temporarily inhibit and/or modify the fluid flowing from the second component to the first component. For example, the second input 112 of the mixing valve 108 is said to be downstream from the cooling pump 102 even when the load valve 130 is closed. In other example, the cooling pump 102 is said to be downstream from the thermal energy storage 106 even when the recharge valve 122 is closed. In a further example, the second input 112 of the mixing valve 108 is said to be downstream from the thermal load 114, even when the recharge pump 124 is not pumping.

The cooling source 104 may include an electrically or mechanically powered apparatus that dissipates thermal energy. The cooling source 104 may dissipate heat from the thermal load 114. For example, the cooling source 104 may receive cooling fluid that was applied the thermal load 114. The cooling source 104 may include an evaporator, a condenser, one or more pumps, valves and/or other components configured to transfer thermal energy and/or dissipate heat. In some examples, the cooling source 104 may provide vapor cooling. For example, the cooling source 104 may include a vapor-compression refrigeration system. The cooling source 104 may circulate a refrigerant through a condenser and the evaporator. As cooling fluid is applied to the evaporator, heat may transfer to the evaporator. The refrigerant may cool the evaporator.

The thermal energy storage 106 may include an apparatus that stores cooling capacity and/or absorbs thermal power. For example, thermal energy storage 106 may store cooling capacity in the form of temperature difference (sensible heat) or in the form of a phase change (latent heat). For example, the thermal energy storage 106 may include a tank or any other kind of reservoir. The thermal energy storage 106 may store cooling fluid that was cooled by the cooling source 104. In some examples, the thermal energy storage 106 may supplement cooling provided by the cooling source 104. For example, cooling fluid from the thermal energy storage 106 may be applied to the thermal load 114.

The mixing valve 108 may include a valve that blends cooling fluid from two or more sources. The mixing valve 108 may include multiple inputs, such as the first input 110, the second input 112, and/or any number of additional inputs. The mixing valve 108 may provide the output that comprises a mixture of cooling fluid received from one or more of the inputs. In some examples, the mixing valve 108 may bias one or more of the inputs. For example, the mixing valve 108 may receive more cooling fluid from the first input 110 and less cooling fluid from the second input 112. Alternatively or in addition, the mixing valve 108 may bias one or more of the inputs to achieve the target cooling temperature. For example, the second input 112 of the mixing valve may receive cooling fluid that is warmer than cooling fluid received by the first input 110. The mixing valve may bias the second input 112 to increase a temperature of the output fluid flow 119. The mixing valve may bias the first input 110 to decrease the temperature of the output fluid flow 119.

In some examples, the thermal load 114 may include a device that receives cooling. The thermal load 114 may generate heat in transient and/or steady-state operation. Alternatively or in addition, the thermal load 114 may operate in various states. When operating in each state, the thermal load 114 may produce different amounts of heat, which may increase or decrease over time. In some examples, the thermal load 114 may operate efficiently and/or properly within a temperature band or close to a predetermined target cooling temperature. The mixing valve 108 may cool the thermal load 114 within the temperature band or to the target cooling temperature.

The controller 132 may communicate one or more control signal to the mixing valve to cause the mixing valve bias one or more input of the mixing valve 108. In some examples, the controller 132 may directly control the mixing valve. For example, the control signals from the controller 132 may actuate various components of the mixing valve. Alternatively or in addition, the mixing valve 108 may include a valve controller. The valve controller may include a processor, microcontroller, and/or some other electronic computer. Alternatively or in addition, the valve controller may include a thermostat which controls the temperature of the output fluid flow 119. The valve controller may cause the mixing valve 108 to bias one or more of the inputs of the mixing valve 108. In some examples, the controller 132 may communicate one or more control signal to the valve controller. For example, the valve controller may receive and/or access a temperature value input. The temperature value input may include the target cooling temperature. In some examples, the controller 132 may communicate the target cooling temperature to the valve controller. The valve controller may cause the mixing valve to bias one or more inputs of the mixing valve to cause a temperature of the output fluid flow 119 to be at or near the target cooling temperature.

The system 100 may switch between cooling modes. Switching between the cooling modes may involve adjusting, enabling, and/or disabling one or more flows of cooling fluid. For example, switching between the modes may involve independently opening or closing the recharge valve 122 and/or one or more load valves. Alternatively or in addition, switching between the cooling modes may involve independently operating the recharge pump 124 or ceasing operation of the recharge pump 124.

The cooling modes may include a recharge mode and a load mode. Switching to the recharge mode may cause the thermal energy storage to rapidly recharge. While in recharge mode, the cooling source may receive cooling fluid from the thermal load that is not heated by the thermal load. The cooling pump 102 may circulate cooling fluid received from the thermal energy storage 106 to the cooling source 104 and back to the thermal energy storage 106. Switching to the recharge mode may involve opening the recharge valve 122, operating the recharge pump 124, and/or closing one or more load valves.

Switching to the load mode may increase the ability of the thermal energy storage 106 to cool the thermal load 114. For example, switching to the load valve may cause the recharge valve 122 to close. When the recharge valve is closed, the mixing valve may be able to receive a higher flow rate from the thermal energy storage. As the thermal demand of the thermal load 114 increases, the mixing valve may bias cooling fluid from the thermal energy storage. The higher flow rate may result in increased cooling for the thermal load. Switching to the load mode may involve opening one or more load valves to cause the cooling pump 102 to pump cooling fluid to the first input 110 and the second input 112 of the mixing valve 108. Alternatively or in addition, switching to the load mode may involve closing the recharge valve 122 and/or ceasing operating of the recharge pump 124.

In some examples, the cooling modes may include multiple load modes. Multiple load valves may facilitate switching between each of the load modes. The load valves may independently open and/or close to vary a source of cooling fluid to at least one of the inputs of the mixing valve 108. As previously discussed, chilled cooling fluid from the thermal energy storage 106 may mix with warmer cooling fluid to maintain the target cooling temperature of the output fluid flow 119 from the mixing valve 108. The cooling potential of the thermal energy storage 106 may be preserved by varying the source of the warmer cooling fluid. When the thermal demand of the thermal load 114 is low, the source of the warmer fluid may include cooling fluid heated by the thermal load 114 from the cooling pump 102. When the thermal demand of the thermal load is high, the source of the warmer cooling fluid may include cooling fluid cooled by the cooling source 104 that bypasses the thermal energy storage 106.

Figure 2A:
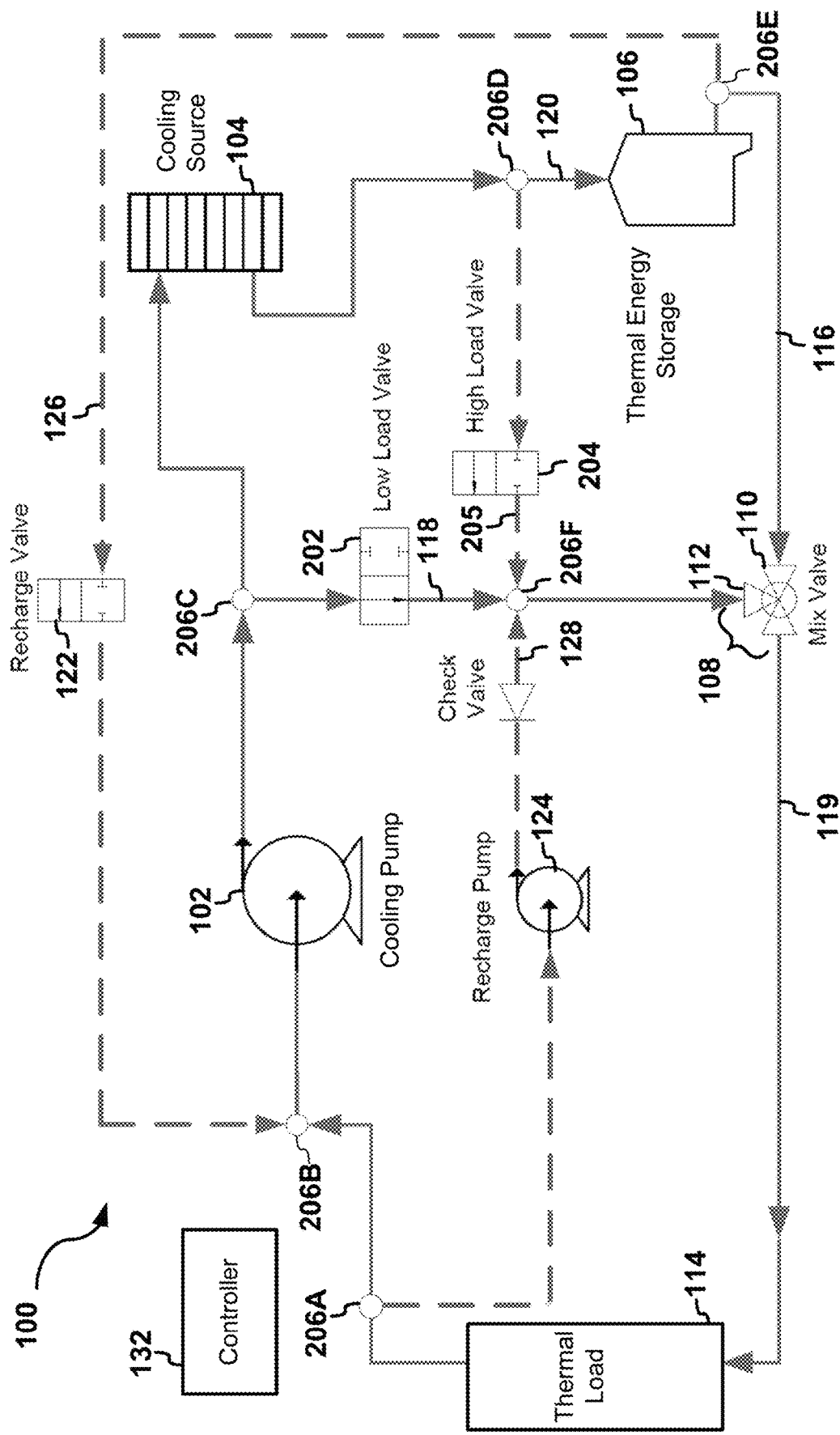
FIG. 2A-C illustrates a second example of a system.
Figure 2B:
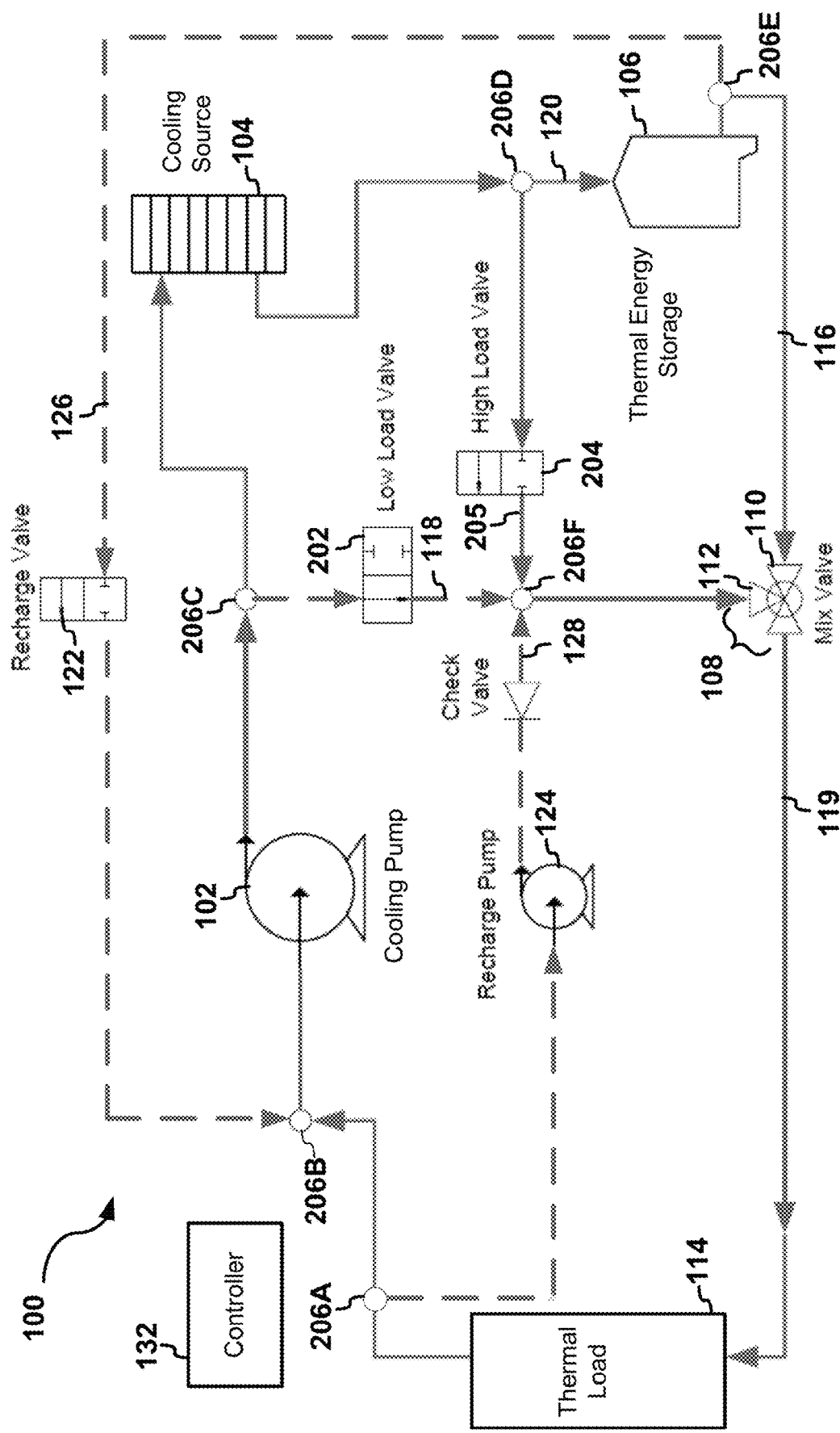
Figure 2C:
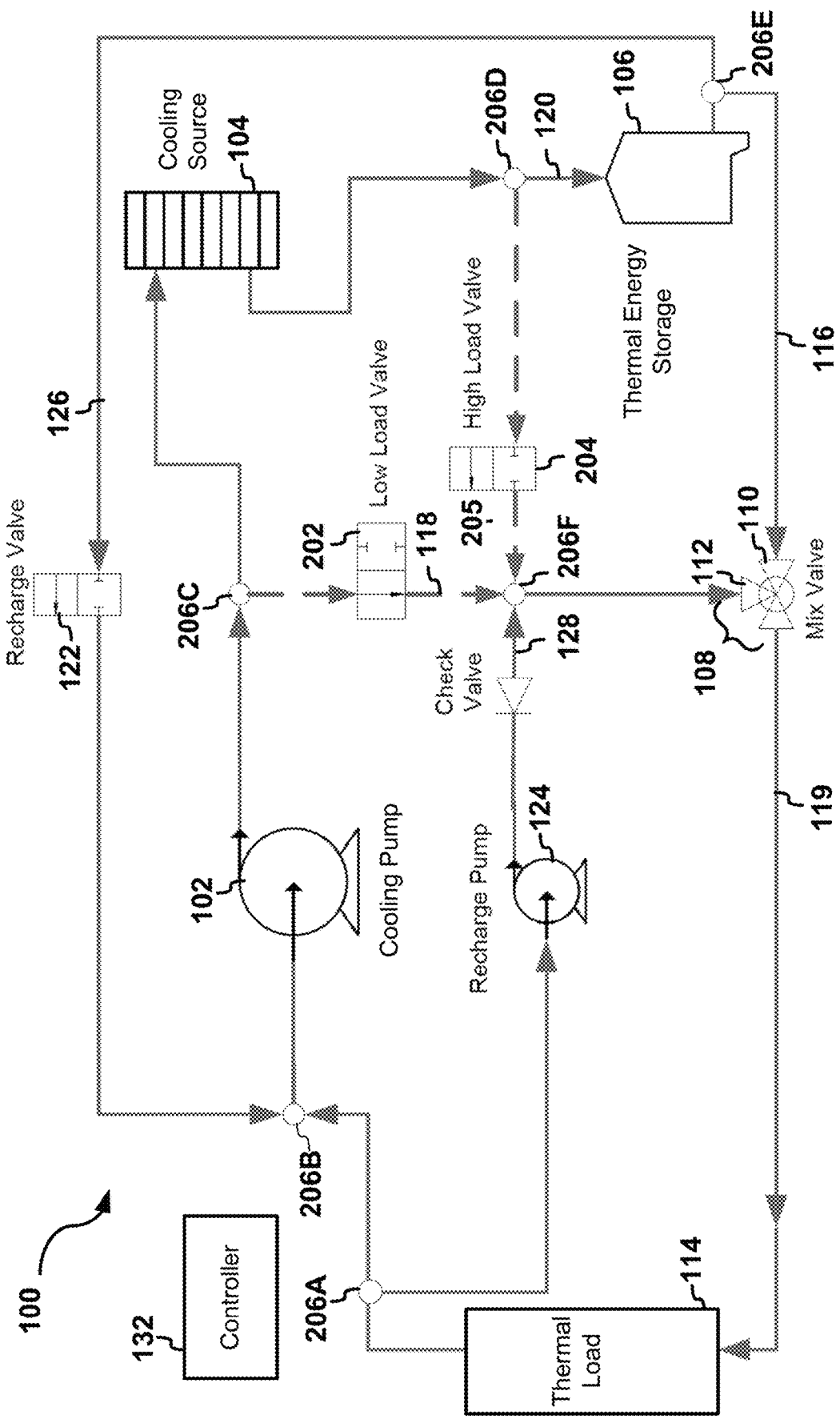

FIGS. 2A-C illustrates a second example of the system 100. The system may include load valves 202, 204. The load valves 202, 204 may include a low-load valve 202 and a high-load valve 204. FIG. 2A illustrates an example of the system 100 operating in low-load mode, FIG. 2B illustrates an example of the system 100 operating in high-load mode. FIG. 2C illustrates an example of the system 100 operating in recharge mode. Referring to FIG. 2A, the cooling pump 102 may be in fluid communication with the thermal load 114, the cooling source 104, and the low-load valve 202. The cooling source 104 may be in fluid communication with the high-load and the thermal energy storage 106. The first input 110 of the mixing valve 108 may be in fluid communication with the thermal energy storage 106. The second input 112 of the mixing valve 108 may be in fluid communication with the low-load valve 202 and the high-load valve 204.

Coordinated operation of the low-load valve 202 and the high-load valve 204 may cause cooling fluid to flow to the second input 112 of the mixing valve 108 from various sources in the system 100. When the low-load valve 202 is opened, the mixing valve 108 may provide cooling to the thermal load 114 with cooling fluid that is a mixture of a first fluid flow 116 received from the thermal energy storage 106 and a second fluid flow 118 comprising cooling fluid heated by the thermal load 114 and pumped through the cooling pump 102. Alternatively or in addition, when the high-load valve 204 is opened, the mixing valve 108 may provide cooling the thermal load 114 with cooling fluid that is a mixture of the first fluid flow 116 received from the thermal energy storage 106 and a fourth fluid flow received from the cooling source 104.

As illustrated in FIG. 2A, the system 100 may operate in a low-load mode. Switching to the low-load mode may involve opening the low-load valve 202 and closing the high-load valve 204. Opening the low-load valve 202 may enable the second fluid flow 118 (illustrated as a solid line in FIG. 2A). Closing the high-load valve 204 my disable the fourth fluid flow (illustrated as a dashed line in FIG. 2A). Alternatively or in addition, when the low-load valve 202 is opened, heated cooling fluid pumped from the thermal load 114 may split between the second input 112 of the mixing valve 108 and the cooling source 104.

When the thermal demand of the thermal load 114 is low, a temperature of the second fluid flow 118 may be low enough such that only a small amount of cooled cooling fluid is needed to achieve the target cooling temperature. For example, the mixing valve 108 may bias the second input 112 of the mixing valve 108 over the first input 110 of the mixing valve 108 to achieve the target cooling temperature.

Referring to FIG. 2B, the system may also operate in a high-load mode. Switching to the high-load mode may involve closing the low-load valve 202 and opening the high-load valve 204. Closing the low-load valve 202 may disable the second fluid flow 118 (illustrated as a dashed line in FIG. 2B). Opening the high-load valve 204 may enable a fourth fluid flow (illustrated as a solid line in FIG. 2B).

The fourth fluid flow 205 may include cooling fluid from the cooling source 104 that bypasses the thermal energy storage 106. Alternatively or in addition, the fourth fluid flow 205 may include cooling fluid heated by the thermal load 114 that passes through the cooling source 104 and is cooled by the cooling source 104. The cooling pump 102 may cause the fourth fluid flow 205. The fourth fluid flow 205 may bypass the thermal energy storage 106 after being cooled by the cooling source 104. The fourth fluid flow 205 may flow to the second input 112 of the mixing valve 108. The high-load valve 204 may regulate the fourth fluid flow. Opening the high-load valve 204 may enable the fourth fluid flow 205. Closing the high-load valve 204 may disable the fourth fluid flow 205.

When the high-load valve 204 is opened, heated cooling fluid from the thermal load 114 may flow to the cooling source 104. Cooling fluid flowing from the cooling source 104 may split between the second input 112 of the mixing valve 108 and the thermal energy storage 106. The cooling fluid from the cooling source 104 flow may flow to the second input 112 of the mixing valve 108 while a balance is sent through the thermal energy storage 106 to mix with colder, precooled cooling fluid stored in the thermal energy storage 106.

Referring to FIG. 2C, the system 100 may also operate in a recharge-mode. Switching to the high-load mode may involve closing one or more of the low-load valve 202 and the high-load valve 204. Alternatively or in addition, switching to recharge mode may involve operating the recharge pump 124 and opening the recharge valve 122. Closing the low-load valve 202 may disable the second fluid flow 118 (illustrated as a dashed line in FIG. 2C). Closing the high-load may disable the fourth fluid flow 205 (illustrated as a dashed line in FIG. 2C). Opening the recharge valve 122 may enable the recharge fluid flow 126 (illustrated as a solid line in FIG. 2C). Operating the recharge pump 124 may cause for bypass fluid flow 128 (illustrated as a solid line in FIG. 2C).

The system 100 may be implemented in various ways. As illustrated in FIGS. 2A-C, the system 100 may include the recharge valve 122, the recharge pump 124, the low-load valve 202, and the high-load valve 204. In other examples, the system 100 may include the load-load valve and the high-load valve 204 without the recharge pump 124 and recharge valve 122. In other examples, the system 100 may include the recharge valve 122 and the recharge pump 124 without the low-load valve 202 and/or the high-load valve 204.

In some examples, the system 100 may include junctions 206A-F. The junctions 206A-F may split and/or combine one or more flows of cooling fluid. For example the junctions 206A-F may include a first junction 206A. The first junction may be in fluid communication with the thermal load 114, the cooling pump 102 and/or the recharge pump 124. The first junction 206A may be downstream from the thermal load 114. The cooling pump 102 and the recharge pump 124 may each be downstream from the first junction 206A. The first junction 206A may receive cooling fluid from the thermal load 114 and split the cooling fluid between the recharge pump 124 and the cooling pump 102.

The junctions 206A-F may include a second junction 206B. The second junction 206B may be in fluid communication with the thermal load 114, the cooling pump 102, and/or the recharge valve 122. Alternatively or in addition, the second junction 206B may be in fluid communication with the first junction 206A. The second junction 206B may be downstream from the thermal load 114, the recharge valve 122, and/or the first junction 206A. For example, heated cooling fluid may flow from the thermal load 114, through the first junction 206A and to the second junction 206B. The second junction 206B may receive the heated cooling fluid from the thermal load 114. Alternatively or in addition, the second junction 206B may receive cooling fluid recirculated from the thermal energy storage 106 via the recharge valve 122. The cooling pump 102 may draw cooling fluid from the thermal load 114 via the second junction 206B. Alternatively or in addition, the cooling pump 102 may draw cooling fluid from the thermal energy storage 106 via the second junction 206B in response to the recharge valve 122 being opened (illustrated in FIG. 2C).

The junctions 206A-F may include a third junction 206C. The third junction 206C may be in fluid communication with the cooling pump 102, the cooling source 104, the low-load valve 202, and/or the mixing valve 108. Alternatively or in addition, the third junction 206C may be downstream from the cooling pump 102. The low-load valve 202, the mixing valve 108, and/or the cooling source 104 may be downstream from the third junction 206C. The third junction 206C may split cooling fluid received from the cooling pump 102 between the cooling source 104 and/or the mixing valve 108. For example, in response to the low-load valve 202 opening, the third junction 206C may split the cooling fluid received from the cooling pump 102 between the mixing valve 108 and the cooling source 104 (illustrated in FIG. 2B).

The junctions 206A-F may include a fourth junction 206D. The fourth junction 206D may be in fluid communication with the cooling source 104, the high-load valve 204, the mixing valve 108, and/or the thermal energy storage 106. The fourth junction 206D may be downstream from the cooling source 104. The high-load valve 204, the mixing valve 108 and/or the thermal energy storage 106 may be downstream from the fourth junction 206D. The fourth junction 206D may receive cooling fluid cooled by the cooling source 104. The fourth junction 206D may be in fluid communication with the high-load valve 204 and the thermal energy storage 106. In response to the high-load valve 204 opening, the fourth junction 206D may split the cooling fluid received from the cooling source 104 between the mixing valve 108 and the thermal energy storage 106 (as illustrated in FIG. 2B).

The junctions 206A-F may include a fifth junction 206E. The fifth junction 206E may be in fluid communication with the thermal energy storage 106, the mixing valve 108, the recharge valve 122, the second junction 206B, and/or the cooling pump 102. The fifth junction 206E may be downstream from the thermal energy storage 106. The first input 110 of the mixing valve 108, the recharge valve 122, the second junction 206B, and/or the cooling pump 102 may be downstream from the fifth junction 206E. The fifth junction 206E may receive cooling fluid from the thermal energy storage 106. The fifth junction 206E may be in fluid communication with the recharge valve 122 and the mixing valve 108. In response to the recharge valve 122 opening, the fifth junction 206E may split the cooling fluid received from the thermal energy storage 106 between the mixing valve 108 and the cooling pump 102 (as illustrated in FIG. 2C).

The junctions 206A-F may include a sixth junction 206F. The sixth junction 206F may be in fluid communication with the mixing valve 108, the recharge pump 124, the cooling pump 102, the low-load valve 202, the high-load valve 204, the cooling source 104, the third junction 206C and/or the fourth junction 206D. The sixth junction 206F may be downstream from the recharge pump 124, the cooling pump 102, and/or the cooling source 104. Alternatively or in addition, the sixth junction 206F may be downstream from the low-load valve 202 and the high-load valve 204. The sixth junction 206F may receive cooling fluid from the recharge pump 124, the low-load valve 202, and/or the high-load valve 204. In response to the low-load valve 202 opening, the sixth junction 206F may receive heated cooling fluid pumped from the thermal load 114 by the cooling pump 102 (as illustrated in FIG. 2A). In response to the high-load valve 204 opening, the sixth junction 206F may receive cooling fluid that is cooled by the cooling source 104 without flowing to the thermal energy storage 106 (as illustrated in FIG. 2B). In response to operation of the recharge pump 124, the sixth junction 206F may receive the cooling fluid heated by the thermal load 114 (as illustrated in FIG. 2C).

In some examples, the cooling pump 102 may pump cooling fluid received from an output of the thermal load 114. The cooling pump 102 may cause the cooling fluid heated by the thermal load 114 to flow to the cooling source 104, low-load valve 202, high-load valve 204, thermal energy storage 106, the mixing valve 108, one or more of the junctions 206A-F, and/or an input of the thermal load 114. Alternatively or in addition, the recharge pump 124 may cause cooling fluid received from the thermal load 114 to flow to the check valve 129, the mixing valve 108, and/or the thermal load 114. The cooling source 104 and the low-load valve 202 may be downstream from the cooling pump 102. The high-load valve 204 and thermal energy storage 106 may be downstream from the cooling source 104. The first input 110 of the mixing valve 108 may be downstream from the thermal energy storage 106. The second input 112 of the mixing valve 108 may be downstream from the low-load valve 202, the high-load valve 204, and/or the recharge pump 124. The thermal load 114 may be downstream from the output 113 of the mixing valve 108.

In some examples, the system 100 to switch between the recharge mode, the low-load mode, and/or the high-load mode based on the thermal demand of the thermal load 114. For example, the system 100 may switch from the recharge mode to low-load mode when the thermal demand increases more than a first predetermined threshold, such as 100 kW. The system 100 may switch from low-load mode to high-load mode when the thermal demand increases more than a second predetermined threshold, such as 100 kW. The system 100 may switch to low-load or recharge mode when the thermal demands decreases by one or more other predetermined thresholds. Additional information may be acquired and used to determine when to switch between the cooling modes of the system. For example, the controller may acquire temperature measurements, power measurements, and other measurements to switch between the cooling modes of the system.

Figure 3:
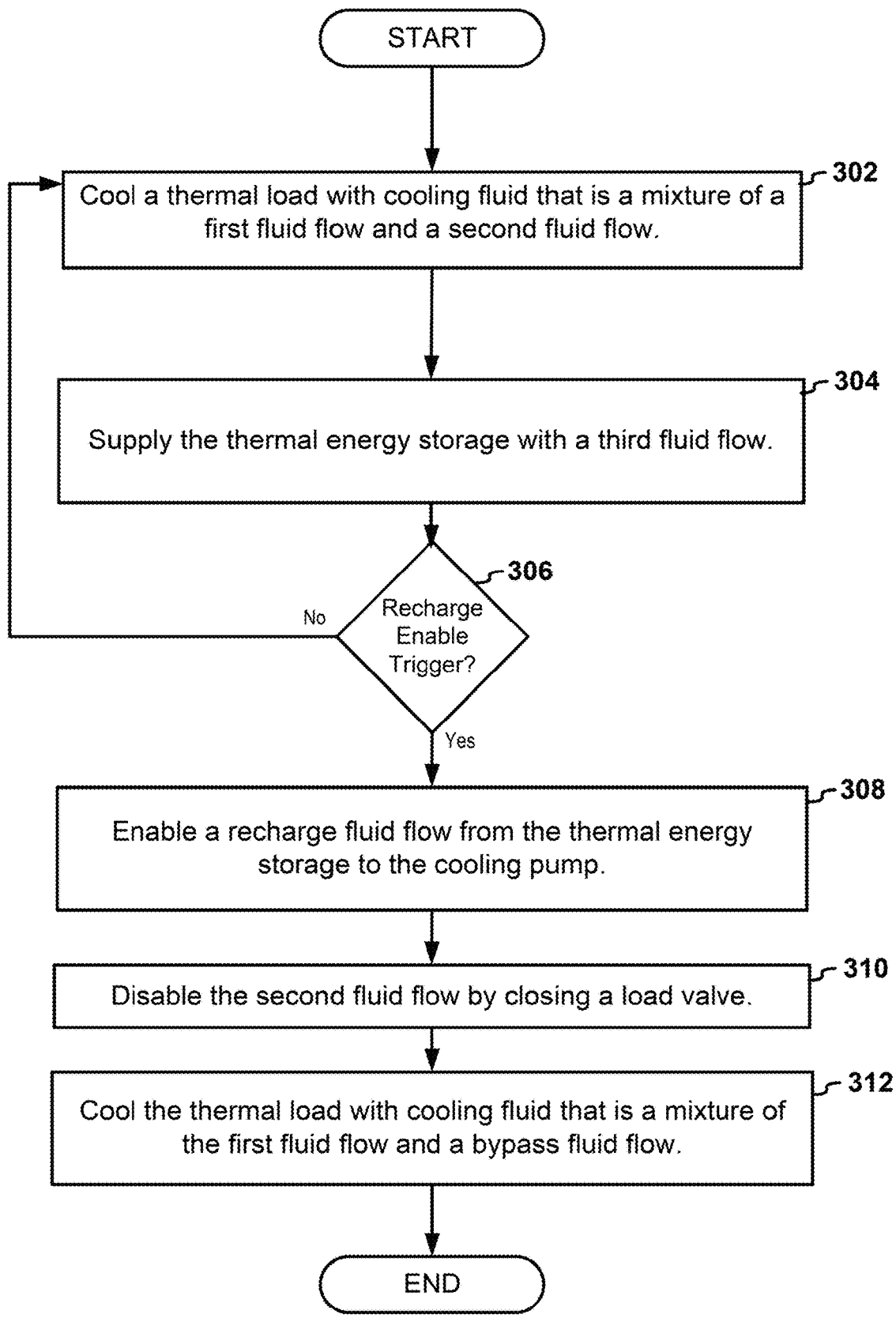
FIG. 3 illustrates a first example of a flow diagram for logic of a system.

FIG. 3 illustrates a first example of a flow diagram for logic of the system 100. The controller 132 may cause the thermal load 114 to be cooled with cooling fluid that is a mixture of the first fluid flow 116 received from the thermal energy storage 106 and a second fluid flow 118 that bypasses the thermal energy storage 106. (302). For example, the controller 132 may open the load valve to supply the mixing valve 108 with cooling fluid pumped by the cooling pump 102. In some examples, the second fluid flow 118 may optionally be cooled by the cooling source 104 after being heated by the thermal load 114. For example, the system 100 may the open the high-load valve 204 to provide the mixing valve 108 with cooling fluid cooled by the cooling source 104 (as illustrated in FIG. 2B).

The controller 132 may cause the system 100 to supply the thermal energy storage 106 with the third fluid flow 120 that comprises cooling fluid heated by the thermal load 114 and cooled by the cooling source 104 (304). For example, the cooling pump 102 may pump cooling fluid heated by the thermal load 114 through the cooling source 104 and to the thermal energy storage 106. In some examples, cooling fluid heated by the thermal load 114 may split between the cooling source 104 and the second input 112 of the mixing valve 108 in response to the low-load valve 202 being opened. Alternatively, cooling fluid heated by the thermal load 114 and cooled by the cooling source 104 may split between the thermal energy storage 106 and the second input 112 of the mixing valve 108 in response to the high-load valve 204 being opened.

The controller 132 may detect a recharge enable trigger (306). The recharge enable trigger may include an signal causes the controller to recharge the thermal energy storage 106. The recharge enable trigger may include a temperature measurement, an analog or digital signal, a message, and/or a received communication. In some examples, detection of the recharge enable trigger may include determination that cooling fluid stored in the thermal energy storage 106 is less than a predetermine temperature value. Alternatively or in addition, the recharge enable trigger may include an operating state of the system 100. For example, detection of the recharge enable trigger may include detection of system start up. In other examples, the detection of the recharge enable trigger may include receipt of a signal. For example, the thermal load 114, or some other device, may send the controller 132 a signal that indicates an operational mode of the thermal load 114. Alternatively or in addition, the recharge enable trigger may be based determination that a cooling capacity of the thermal energy storage is below a threshold value. In some examples, the cooling capacity may be calculated based at least one of a temperature of fluid in the thermal energy storage or an ambient temperature around the thermal energy storage.

In response to detection of the recharge enable trigger (306, yes), the controller 132 may cause the system 100 to switch to a recharge mode. In response to the recharge enable trigger, the controller 132 may enable the recharge fluid flow 126 from the thermal energy storage 106 to the cooling pump 102 (308). For example, the controller 132 may open the recharge valve 122 to enable the recharge fluid flow 126. Opening the recharge valve 122 may cause the cooling pump 102 to draw cooling fluid from the thermal energy storage 106 and recirculate the cooling fluid to the cooling source 104.

The controller 132 may disable the second fluid flow 118 by closing the load valve 130 (310). For example, in response to the recharge mode, the controller 132 may close the load valve 130 to disable the second fluid flow 118. Alternatively or in addition the controller 132 may close multiple load valves. For example, the controller 132 may close the low-load valve 202 and/or the high-load valve 204 (as illustrated in FIG. 2C). For example, when the system 100 enters the recharge mode from a low-load mode, the controller 132 may close the low-load valve 202. Alternatively or in addition, when the system 100 enters the recharge mode from the high-load mode, the controller 132 may close the high-load valve 204.

The controller 132 may cause the system 100 to cool the thermal load 114 with cooling fluid that is a mixture of the first fluid flow 116 received from the thermal energy storage 106 and the bypass fluid flow 128 comprising cooling fluid that is heated by the thermal load 114 and pumped through a recharge pump 124 (312). For example, in response to detection of the recharge mode, the controller 132 may cause the recharge pump 124 to pump the bypass fluid flow 128. Cooling fluid heated by the thermal load 114 may flow from the thermal load 114 to the mixing valve 108.

Figure 4:
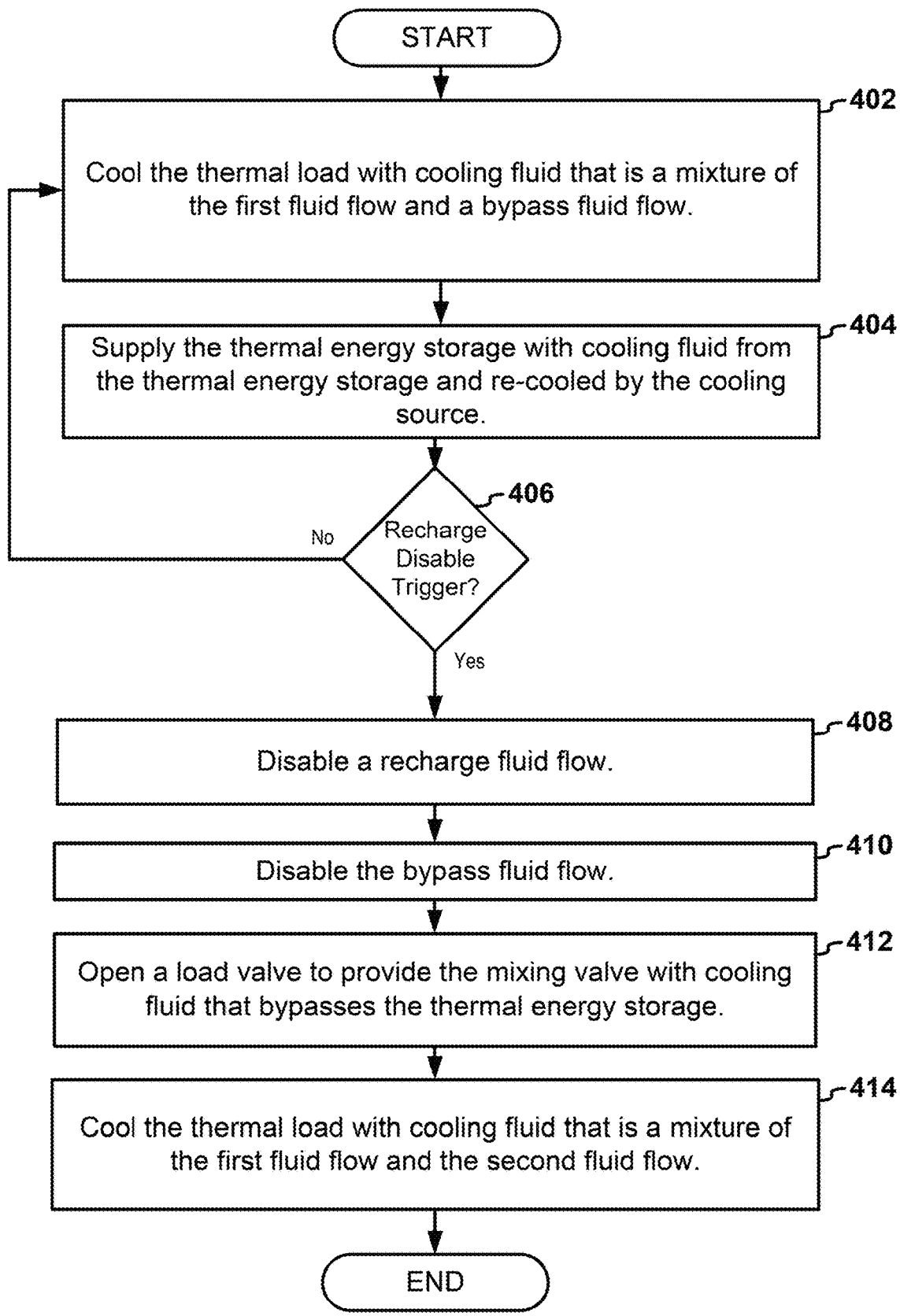
FIG. 4 illustrates a second example of a flow diagram for logic of a system.

FIG. 4 illustrates a second example of a flow diagram for logic of the system 100. In some examples, the controller 132 and/or the system 100 may operate in the recharge mode. The controller 132 may cause the thermal load 114 to be cooled with cooling fluid that is a mixture of the first fluid flow 116 received from the thermal energy storage 106 and the bypass fluid flow 128 comprising cooling fluid that is heated by the thermal load 114 and pumped through a recharge pump 124 (402). While in the recharge mode, the recharge pump 124 may pump the cooling fluid heated by the thermal load 114 to the mixing valve 108.

The cooling source 104 may supply the thermal energy storage 106 with cooling fluid from the thermal energy storage 106 and cooled by the cooling source 104 (404). For example, in response to the recharge valve 122 being opened, cooling fluid from the thermal load 114 may flow from the cooling pump 102, to the cooling source 104, and back to the thermal energy storage 106.

The controller 132 may detect a recharge disable trigger (406). The recharge disable trigger may include a signal that causes the controller to cease operation of the recharge pump 124 and/or close the recharge valve 122. Alternatively or in addition, the recharge disable trigger may cause the controller to switch to the low-load mode, high-load mode, or some other cooling mode. The recharge disable trigger may include a temperature measurement, an analog or digital signal, a message, and/or a received communication. In some examples, detection of the recharge enable trigger may include determination that cooling fluid stored in the thermal energy storage 106 is greater than a predetermine temperature value. Alternatively or in addition, the recharge disable trigger may be based on the cooling capacity of the thermal energy storage. Alternatively or in addition, the recharge disable trigger may include an operating state of the controller 132 and/or the system 100. For example, the recharge disable trigger may include a low-load enable trigger or a high-load enable trigger (described below in reference to FIG. 5). In other examples, the detection of the recharge disable trigger may include receipt of a signal. For example, the thermal load 114, or some other device, may send the controller 132 a signal that indicates the recharge disable trigger.

In response to detection of the recharge disable trigger (406, yes), the system 100 may switch to a load mode (408-414). The controller 132 may disable a recharge fluid flow 126 comprising cooling fluid from the thermal energy storage 106 that flows to the cooling pump 102 (408). For example, the controller 132 may close the recharge valve 122.

The controller 132 may disable the bypass fluid flow 128 (410). For example, the controller 132 may cause the recharge pump 124 to cease operating in response to detection of the recharge disable trigger. The cooling pump 102 may continue operating after the recharge pump 124 ceases operating.

The controller 132 may open the load valve to provide the mixing valve 108 with cooling fluid that bypasses the thermal energy storage 106 (412). For example, the controller 132 may open the low-load valve 202 and/or the high-load valve 204.

The controller 132 may cause the thermal load 114 to be cooled with a mixture of the first fluid flow 116 received from the thermal energy storage 106 and the second fluid flow 118 (414). In other examples the controller 132 may cause the thermal load 114 to be cooled with cooling fluid that is a mixture of the first fluid flow 116 received from the thermal energy storage 106 and the fourth fluid flow received from the cooling source 104.

Figure 5:
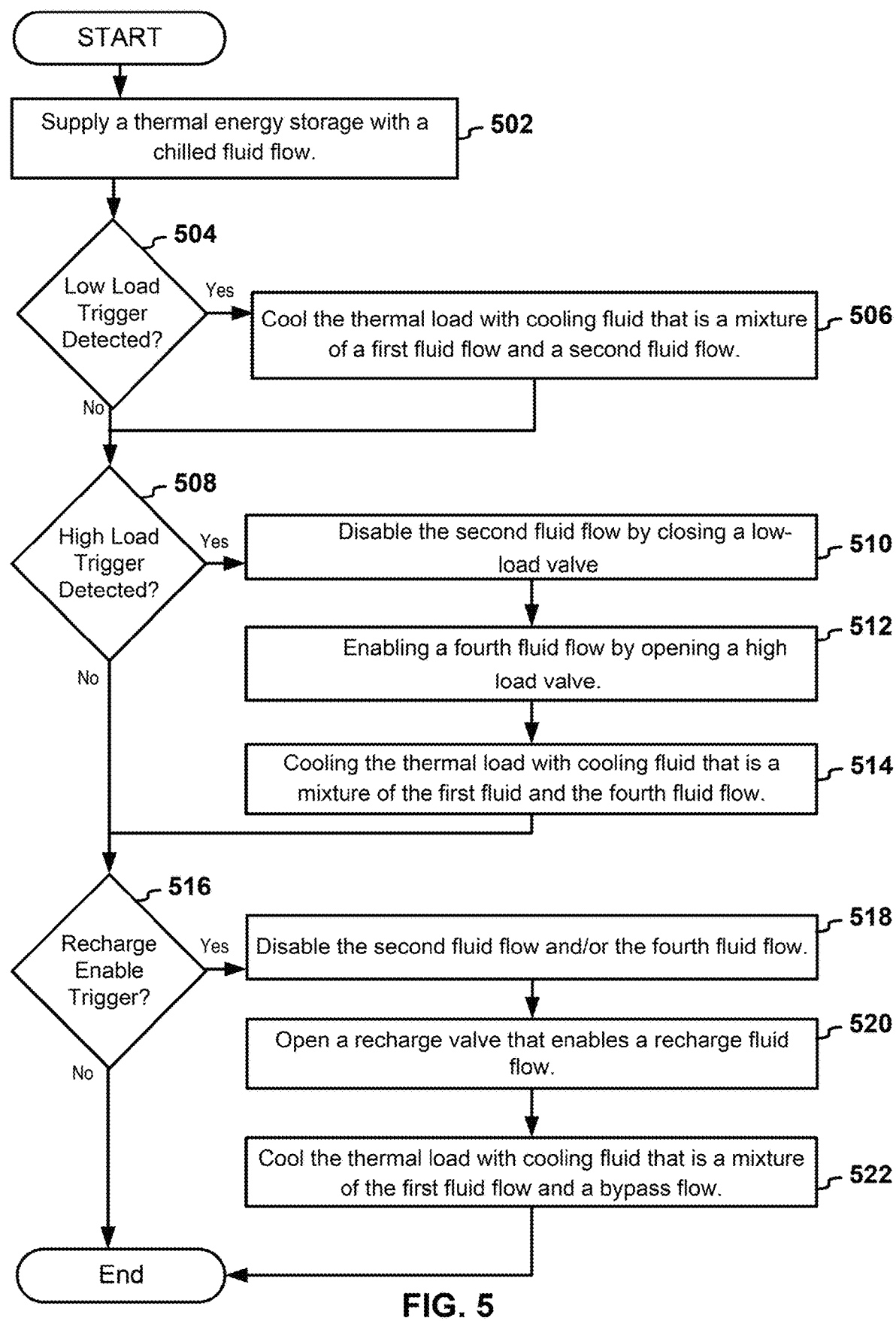
FIG. 5 illustrates a third example of a flow diagram for logic of a system.

FIG. 5 illustrates a third example of a flow diagram for logic of the system 100. The controller 132 may cause the thermal energy storage 106 to be supplied with the a chilled cooling flow that comprises cooling fluid heated by the thermal load 114 and cooled by the cooling source 104 (502). The chilled cooling flow may refer to cooling fluid cooled by the cooling source 104, such as the third fluid flow 120 previously discussed in reference to FIG. 1 and FIG. 2A-C. In some examples, the thermal energy storage 106 may receive cooling fluid from the cooling fluid heated by the thermal load 114 and cooled by the cooling source 104 regardless of an operational mode, such as the low-load mode the high-load mode, and/or the recharge mode. For example, in response to the low-load valve 202 being opened, the cooling fluid pumped from the thermal load 114 may split between the mixing valve 108 and the cooling source 104. Cooling fluid from the cooling source 104 may flow to the thermal energy storage 106. Alternatively, when the high-load valve 204 is opened, the cooling fluid pumped from the thermal load 114 and cooled by the cooling source 104 may split between the thermal energy storage 106 and the mixing valve 108. Alternatively, when the low-load valve 202 and high-load valve 204 are both closed, the cooling fluid pumped from the thermal load 114 may flow to the thermal energy storage 106 without flowing to the mixing valve 108 prior to flowing to the thermal energy storage 106. The cooling source 104 may receive the chilled fluid flow in the low-load mode, high-load mode, and/or the recharge mode.

The controller 132 may detect a low-load trigger (504). The low-load trigger may include a signal that causes the controller to switch into low-load mode. Detection of the low-load trigger may include receipt of the signal. In some examples, detection of the low-load trigger may include determination of an operational mode of the thermal load 114. In some examples, the same signal may cause the system to switch between low-load mode and high-load mode and/or low-load mode and recharge mode. Alternatively or in addition, detection of the low-load trigger may include determination that the thermal demand of the thermal load 114 is lower than a predetermined threshold demand value and/or determining a temperature of the thermal load 114 is less than a predetermined temperature value. Alternatively or in addition, detection of the low-load trigger may include one or more calculation based on a measurement of a cooling fluid temperature, a measurement of a temperature of the thermal load 114, a measurement of a power demand of the thermal load 114, and/or any other electrical or temperature measurement related to the thermal load 114 or components involved in cooling the thermal load 114.

In response to detection of the low-load trigger, (504, yes) the controller 132 may cause the thermal load 114 to be cooled with cooling fluid that is a mixture of the first fluid flow 116 received from the thermal energy storage 106 and the second fluid flow 118 comprising cooling fluid heated by the thermal load 114 and pumped through the cooling pump 102 (506). For example, the controller 132 may cause the low-load valve 202 to open or remain opened. In some examples, the high-load valve 204 may have been previously opened. In response to detection of the low-load trigger, the controller 132 may cause the high-load valve 204 to close or remain closed. When the low-load valve 202 is opened, some of the cooling fluid heated by the thermal load 114 and pumped by the cooling pump 102 may bypass the cooling source 104 and flow to the second input 112 of the mixing valve 108.

The controller 132 may detect a high-load trigger (508). The high-load trigger may include a signal that causes the controller to switch into high-load mode. For example, detection of the high-load trigger may include receipt of the signal. In some examples, the same signal may cause the controller to switch between low-load mode and high-load mode and/or between high-load mode and recharge mode. In some examples, detection of the high-load trigger may include determination of an operational mode of the thermal load 114. Alternatively or in addition, detection of the low-load trigger may include determination that the thermal demand of the thermal load 114 is greater than a predetermined threshold demand value. Alternatively or in addition, detection of the low-load trigger may include determining a temperature of the thermal load 114 is greater than a predetermined temperature value. In some examples, detection of the low-load trigger may include one or more calculations based on a measurement of a cooling fluid temperature, a measurement of a thermal load 114 temperature, a measurement of a power demand of the thermal load 114, and/or any other electrical or temperature measurement related to the thermal load 114 or cooling the thermal load 114. In some examples, the high-load enable trigger may include a signal sent to controller 132. Detection of the high-load enable trigger may include receipt of the signal. For example, the controller 132 may receive the signal from the thermal load 114, a device in communication with the thermal load 114, or some other device. The signal may indicate the high-load trigger. Alternatively or in addition, the signal may include a parameter used to detect the high-load trigger.

In response to detection of the high-load trigger (508, yes), the controller 132 may disable the second fluid flow 118 by closing the low-load valve 202 (510). Closing the low-load valve 202 may stop the second fluid flow 118 from flowing to the second input 112 of the mixing valve 108. Alternatively or in addition, closing the low-load valve 202 may stop the mixing valve 108 from receiving cooling fluid heated by the thermal load 114 that bypasses the cooling source 104.

The controller 132 may enable a fourth fluid flow by opening the high-load valve 204 (512). Opening the high-load valve 204 may cause cooling fluid heated by the thermal load 114 and cooled by the cooling source 104 to split between the second input 112 of the mixing valve 108 and the thermal energy storage 106. In some examples, the cooling fluid heated by the thermal load 114 and cooled by the cooling source 104 may split between the mixing valve 108 and the thermal energy storage 106 at the fourth junction 206D.

The controller 132 may cause the thermal load 114 to be cooled with cooling fluid that is a mixture of the first fluid flow 116 received from the thermal energy storage 106 and the fourth fluid flow received from the cooling source 104 (514). For example, in response to detection of the high-load trigger, the controller 132 may open the high-load valve 204 and close the low-load valve 202. Closing the low-load valve 202 may stop the second fluid flow 118 to the second input 112 of the mixing valve 108. Opening the high-load valve 204 may enable the fourth fluid flow. For example, opening the high-load valve 204 may cause cooling fluid heated by the thermal load 114 and cooled by the cooling source 104 to flow to both the second input 112 of the mixing valve 108 and to the thermal energy storage 106. The mixing valve 108 may receive the first fluid flow 116 and the fourth fluid flow. The first fluid flow 116 may include cooling fluid from the thermal energy storage 106. The fourth fluid flow may include cooling fluid that bypasses the thermal energy storage 106.

The controller 132 may detect the recharge enable trigger (516). In some examples, detection of the recharge enable trigger may include determination of an operational mode of the thermal load 114. For example, detection of the recharge enable trigger may include detection of system start up. Alternatively or in addition, detection of the recharge enable trigger may include determination than the thermal energy storage 106 and/or cooling fluid stored in the thermal energy storage 106 is less than a predetermine temperature value. In some examples, detection of the recharge enable trigger may include one or more calculations based on a measurement of a cooling fluid temperature, a measurement of a thermal load 114 temperature, a measurement of a power demand of the thermal load 114, and/or any other electrical or temperature measurement related to the thermal load 114 or cooling the thermal load 114. In some examples, the recharge enable trigger may include a signal sent to the controller 132. Alternatively or in addition, Detection of the recharge enable trigger may include receipt of the signal. For example, the controller 132 may receive the signal from the thermal load 114, a device in communication with the thermal load 114, or some other device. The signal may indicate the recharge enable trigger. Alternatively or in addition, the signal may include a parameter used to detect the recharge enable trigger.

In response to detection of the recharge enable trigger (516, yes), the controller 132 may disable the second fluid flow 118 and/or the fourth fluid flow (518). For example, the controller 132 may close the low-load valve 202 or cause the low-load valve 202 to stay closed. Alternatively or in addition, the controller 132 may close the high-load valve 204 or cause the high-load valve 204 to remain closed. In other examples, the controller 132 may send a signal, or cease sending a signal, to cause the low-load valve 202 and/or the high-load valve 204 to close or remain closed.

The controller 132 may open a recharge valve 122 that enables the recharge fluid flow 126 from the output of the thermal energy storage 106 to the cooling pump 102 (520). The controller 132 may open the recharge valve 122 in response to the recharge enable trigger. For example, the controller 132 may send a signal to the recharge valve 122 that causes the recharge valve 122 to open. The recharge fluid flow 126 may include cooling fluid from the thermal energy storage 106. The cooling pump 102 may draw the cooling fluid from the thermal energy storage 106 in response to the recharge valve 122 being opened. In response to the recharge valve 122 being opened, the cooling pump 102 may pump cooling fluid from the thermal energy storage to the cooling source 104 and then back to the thermal energy storage 106.

The controller 132 may cause cooling of the thermal load 114 with cooling fluid that is a mixture of the first fluid flow 116 received from the thermal energy storage 106 and the bypass fluid flow 128 comprising cooling fluid that is heated by the thermal load 114 and pumped through a recharge pump 124 (522). In response to detection of the recharge enable trigger, the recharge pump 124 may cause the bypass fluid flow 128 to the mixing valve 108. The bypass fluid flow 128 may include cooling fluid that bypasses the cooling pump 102, the cooling source 104, and/or the thermal energy storage 106. The bypass fluid flow 128 may flow to the second input 112 of the mixing valve 108 and mix with cooling fluid from the first fluid flow 116 that flows from the thermal energy storage 106 to the first input 110 of the mixing valve 108.

The operations illustrated in the flow diagrams may be performed in an order different than illustrated. For example, the detection of the low-load trigger (504), the detection of the high-load trigger (508), and the detection recharge enable trigger (516) may occur in other orders than illustrated in FIG. 5.

The logic illustrated in the flow diagrams may include additional, different, or fewer operations than illustrated. For example, in response to detection of the low-load trigger, the controller 132 may cause the first fluid flow 116 to be enabled by opening a low-load valve 202. Alternatively or in addition, in response to detection of the low-load trigger, the controller 132 may cause the fourth fluid flow to be disabled by closing the high-load valve 204.

In some examples, in response to detection of the low-load trigger, the controller 132 may cause the recharge pump 124 to cease operation and/or the recharge valve 122 to close. Alternatively or in addition, in response to detection of the high-load trigger, the controller 132 may cause the recharge pump 124 to cease operation and/or the recharge valve 122 to close.

The controller 132 may cause the mixing valve 108 to adjust between a first input and a second input 112. The first input may receive the first fluid flow 116 and the second input 112 may receive the second fluid flow 118 or the forth fluid flow. In some examples, the controller 132 may send a signal to the mixing valve 108 or the valve controller.

The system 100 may be implemented with additional, different, or fewer components. In some examples, the system 100 may include the cooling pump 102, the cooling source 104, the thermal energy storage 106, the mixing valve 108, the recharge valve 122 and the recharge pump 124. In addition, the system may include the low-load valve 202 and/or the high-load valve 204. Some embodiments with the recharge valve 122 and the recharge pump 124 may include the low-load valve 202 without the high-load valve. Alternatively, the system may include the low-load valve 202 and the high-load valve 204 without the recharge valve 122 and/or without the recharge pump 124.

The system may be implemented in many different ways. The controller 132 may further include one or more devices operable to execute logic of the system 100. For example, the controller may include a processor. In some examples, the system may include a memory. The logic of the system 100 may include computer executable instructions or computer code embodied in the memory or in other memory that when executed by the controller 132, cause the controller 132 to perform the features implemented by the logic of the system 100. The computer code may include instructions executable with the controller 132.

The memory may be any device for storing and retrieving data or any combination thereof. The memory may include non-volatile and/or volatile memory, such as a random access memory (RAM), a read-only memory (ROM), an erasable programmable read-only memory (EPROM), or flash memory. Alternatively or in addition, the memory may include an optical, magnetic (hard-drive) or any other form of data storage device.

In some examples, the memory may include the logic switch between the cooling modes, such as the recharge mode, the low-load mode, and/or the high-load mode described herein. For example, the memory may include logic that causes the components of the system to operate for their intended purpose. For example, the memory may include logic that controls the cooling pump 102, the cooling source 104, the mixing valve 108, the recharge valve 122, the recharge pump 124, low-load valve 202 and/or the high-load valve 204.

Each component may include additional, different, or fewer components. For example, the mixing valve may include a valve controller that operates the mixing valve. The valve controller may be in communication with the controller 132.

The system 100 may be implemented in many different ways. For example, the system 100 may include one or more modules that implement the logic of the system 100. Each module may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory, for example, that comprises instructions executable with the controller 132 or other processor to implement one or more of the features of the module. When any one of the module includes the portion of the memory that comprises instructions executable with the controller 132, the module may or may not include the controller 132. In some examples, each module may just be the portion of the memory or other physical memory that comprises instructions executable with the controller 132 or other processor to implement the features of the corresponding module without the module including any other hardware. Because each module includes at least some hardware even when the included hardware comprises software, each module may be interchangeably referred to as a hardware module.

All or part of the system and its logic and data structures may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL)).

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

1. A system comprising:
    a cooling pump; a cooling source; a thermal energy storage; a mixing valve having a first input and a second input; a low-load valve; a high-load valve; and a controller,
    wherein the cooling pump is in fluid communication with a thermal load, the low-load valve, and the cooling source, wherein the cooling source is in fluid communication with the high-load valve and the thermal energy storage, wherein the first input of the mixing valve is in fluid communication with the thermal energy storage, wherein the second input of the mixing valve is in fluid communication with the low-load valve and the high-load valve,
    wherein the controller is configured to:
        in response to detection of a low-load trigger, cause the low-load valve to open and the high-load valve to close, and
        in response to detection of a high-load trigger, cause the low-load valve to close and the high-load valve to open.

2. The system of aspect 1, wherein detection of the high-load trigger comprises determination that a temperature of cooling fluid provided by the cooling source exceeds a threshold temperature value.

3. The system of any of aspects 1 to 2, wherein the cooling source and the low-load valve are downstream from the cooling pump, wherein the high-load valve and thermal energy storage are downstream from the cooling source, wherein the first input of the mixing valve is downstream from the thermal energy storage and the second input of the mixing valve is downstream from the low-load valve and the high-load valve.

4. The system of any of aspects 1 to 3, wherein the controller is further configured to:
    communicate a signal to the mixing valve that causes the mixing valve to bias the first input of the mixing valve or the second input of the mixing valve.

5. The system of any of aspects 1 to 4, further comprising a first junction and a second junction, wherein the first junction is configured to split cooling fluid received from the cooling pump between the cooling source and the low-load valve, wherein the second junction is configured to split cooling fluid received form the cooling source between the high-load valve and the thermal energy storage.

6. The system of any of aspects 1 to 5, further comprising a recharge pump and a recharge valve, the recharge pump in fluid communication with the thermal load and the second input of the mixing valve and the recharge valve in fluid communication with the thermal energy storage and the cooling pump, wherein the controller is further configured to:
    in response to a recharge enable trigger:
        cause the recharge valve to open,
        cause at least one of the low-load valve or the high-load valve to close, and
        cause the recharge pump to pump cooling fluid from the thermal load to the second input of the mixing valve.

7. The system of any of aspects 1 to 6, wherein the controller is further configured to:
    in response to at least one of the low-load trigger or the high-load trigger:
        cause the recharge valve to close, and
        cause the recharge pump to stop pumping.

8. A method comprising:
    cooling a thermal load with cooling fluid that is a mixture of a first fluid flow received from a thermal energy storage and a second fluid flow comprising cooling fluid heated by a thermal load and pumped through a cooling pump, the second fluid flow controlled by a low-load valve;
    supplying a thermal energy storage with a third fluid flow comprising cooling fluid cooled by a cooling source;
    switching to a high-load mode in response to a high-load trigger, wherein switching to the high-load mode comprises:
        disabling the second fluid flow by closing the low-load valve; enabling a fourth fluid flow by opening a high-load valve, the fourth fluid flow comprising cooling fluid cooled by the cooling source, where the fourth fluid flow is caused by the cooling pump; and
        cooling the thermal load with cooling fluid that is a mixture of the first fluid flow received from the thermal energy storage and the fourth fluid flow received from the cooling source.

9. The method of aspect 8, further comprising:
switching to a low-load mode in response to a low-load trigger, wherein switching to the low-load mode comprises:
enabling the second fluid flow by opening the low-load valve,
disabling the fourth fluid flow by closing the high-load valve, and
cooling the thermal load with the cooling fluid that is the mixture of the first fluid flow and the second fluid flow.
10. The method of any of aspects 8 to 9, further comprising:
switching to a recharge mode in response to a recharge enable trigger, wherein switching to the recharge mode comprises:
enabling a recharge fluid flow by opening a recharge valve, the recharge fluid flow comprising cooling fluid from an output of the thermal energy storage that flows to the cooling pump, and
cooling the thermal load with cooling fluid that is a mixture of the first fluid flow received from the thermal energy storage and a bypass fluid flow comprising cooling fluid that is heated by the thermal load and pumped through a recharge pump.
11. The method of any of aspects 8 to 10, wherein switching to the recharge mode further comprises:
disabling the fourth fluid flow by closing the high-load valve, or
disabling the fourth fluid flow by closing the low-load valve.
12. The method of any of aspects 8 to 11, further comprising:
detecting the high-load trigger by determining that a temperature of cooling fluid cooled by the cooling source is greater than a threshold value.
13. The method of any of aspects 8 to 12, further comprising:
causing a mixing valve to adjust between a first input and a second input, wherein the first input receives the first fluid flow and the second input receives the second fluid flow or the fourth fluid flow.
14. The method of any of aspects 8 to 13, further comprising
pumping, with the cooling pump, the first fluid flow to a first input of a mixing valve; and
pumping, with the cooling pump, the second fluid flow a second input of the mixing valve,
wherein switching to the high-load mode further comprises pumping, with the cooling pump, the fourth fluid flow to the second input of the mixing valve.
15. A system comprising:
a cooling pump; a cooling source; a thermal energy storage; a low-load valve; a high-load valve; and a mixing valve having a first input, a second input, and an output;
wherein the cooling source and the low-load valve are downstream from the cooling pump, wherein the high-load valve and thermal energy storage are downstream from the cooling source, wherein the first input of the mixing valve is downstream from the thermal energy storage and the second input of the mixing valve is downstream from the low-load valve and the high-load valve, wherein the thermal load is downstream from the output of the mixing valve.
wherein cooling fluid from the thermal load and pumped by the cooling pump flows to the second input of the mixing valve in response to the low-load valve being open and the high-load valve being closed,
wherein cooling fluid from the thermal load and cooled by the cooling source flows to the second input of the mixing valve in response to the low-load valve being closed and the high-load valve being opened.
16. The system of aspect 15, further comprising a controller, wherein the controller is further configured to:
in response to detection of a high-load trigger, cause the low-load valve to close and the high-load valve to open.
17. The system of any of aspects 15 to 16, further comprising a controller, wherein the controller is further configured to:
in response to detection of a low-load trigger, cause the low-load valve to open and the high-load valve to close.
18. The system of any of aspects 15 to 17, further comprising a first junction and a second junction, the first junction downstream from the cooling pump and the second junction downstream from the cooling source, wherein the first junction splits cooling fluid received from the cooling pump between the low-load valve and the cooling source, wherein the second junction splits cooling fluid received from the cooling source between the high-load valve and the thermal energy storage.
19. The system of any of aspects 15 to 18, wherein cooling pump is in fluid communication with the low-load valve and the cooling source, the cooling source is in fluid communication with the high-load valve and the thermal energy storage, wherein the first input of the mixing valve receives cooling fluid from the thermal energy storage and the second input of the mixing valve receives cooling fluid from at least one of the low-load valve or the high-load valve.
20. The system of any of aspects 15 to 19, wherein the second input of the mixing valve receives cooling fluid from the cooling pump in response to the low-load valve being opened and the second input of the mixing valve receives cooling fluid from the cooling source in response to the high-load valve being opened.

What is claimed is:
1. A system comprising:
a cooling pump; a cooling source; a thermal energy storage; a mixing valve having a first input and a second input; a low-load valve; a high-load valve; and a controller,
wherein the cooling pump is in fluid communication with a thermal load, the low-load valve, and the cooling source, wherein the cooling source is in fluid communication with the high-load valve and the thermal energy storage, wherein the first input of the mixing valve is in fluid communication with the thermal energy storage, wherein the second input of the mixing valve is in fluid communication with the low-load valve and the high-load valve,
wherein the controller is configured to:
in response to detection of a low-load trigger, cause the low-load valve to open and the high-load valve to close, and
in response to detection of a high-load trigger, cause the low-load valve to close and the high-load valve to open.
2. The system of claim 1, wherein detection of the high-load trigger comprises determination that a temperature of cooling fluid provided by the cooling source exceeds a threshold temperature value.
3. The system of claim 1, wherein the cooling source and the low-load valve are downstream from the cooling pump, wherein the high-load valve and thermal energy storage are downstream from the cooling source, wherein the first input of the mixing valve is downstream from the thermal energy storage and the second input of the mixing valve is downstream from the low-load valve and the high-load valve.

4. The system of claim 1, wherein the controller is further configured to:
communicate a signal to the mixing valve that causes the mixing valve to bias the first input of the mixing valve or the second input of the mixing valve.

5. The system of claim 1, further comprising a first junction and a second junction, wherein the first junction is configured to split cooling fluid received from the cooling pump between the cooling source and the low-load valve, wherein the second junction is configured to split cooling fluid received form the cooling source between the high-load valve and the thermal energy storage.

6. The system of claim 1, further comprising a recharge pump and a recharge valve, the recharge pump in fluid communication with the thermal load and the second input of the mixing valve and the recharge valve in fluid communication with the thermal energy storage and the cooling pump, wherein the controller is further configured to:
in response to a recharge enable trigger:
cause the recharge valve to open,
cause at least one of the low-load valve or the high-load valve to close, and
cause the recharge pump to pump cooling fluid from the thermal load to the second input of the mixing valve.

7. The system of claim 6, wherein the controller is further configured to:
in response to at least one of the low-load trigger or the high-load trigger:
cause the recharge valve to close, and
cause the recharge pump to stop pumping.

8. A system comprising:
a cooling pump; a cooling source; a thermal energy storage; a low-load valve; a high-load valve; and a mixing valve having a first input, a second input, and an output;
wherein the cooling source and the low-load valve are downstream from the cooling pump, wherein the high-load valve and thermal energy storage are downstream from the cooling source, wherein the first input of the mixing valve is downstream from the thermal energy storage and the second input of the mixing valve is downstream from the low-load valve and the high-load valve, wherein the thermal load is downstream from the output of the mixing valve;
wherein cooling fluid from the thermal load and pumped by the cooling pump flows to the second input of the mixing valve in response to the low-load valve being open and the high-load valve being closed,
wherein cooling fluid from the thermal load and cooled by the cooling source flows to the second input of the mixing valve in response to the low-load valve being closed and the high-load valve being opened.

9. The system of claim 8, further comprising a controller, wherein the controller is further configured to:
in response to detection of a high-load trigger, cause the low-load valve to close and the high-load valve to open.

10. The system of claim 8, further comprising a controller, wherein the controller is further configured to:
in response to detection of a low-load trigger, cause the low-load valve to open and the high-load valve to close.

11. The system of claim 8, further comprising a first junction and a second junction, the first junction downstream from the cooling pump and the second junction downstream from the cooling source, wherein the first junction splits cooling fluid received from the cooling pump between the low-load valve and the cooling source, wherein the second junction splits cooling fluid received from the cooling source between the high-load valve and the thermal energy storage.

12. The system of claim 8, wherein cooling pump is in fluid communication with the low-load valve and the cooling source, the cooling source is in fluid communication with the high-load valve and the thermal energy storage, wherein the first input of the mixing valve receives cooling fluid from the thermal energy storage and the second input of the mixing valve receives cooling fluid from at least one of the low-load valve or the high-load valve.

13. The system of claim 8, wherein the second input of the mixing valve receives cooling fluid from the cooling pump in response to the low-load valve being opened and the second input of the mixing valve receives cooling fluid from the cooling source in response to the high-load valve being opened.

* * * * *